(12) United States Patent
Keenihan et al.

(10) Patent No.: US 9,564,545 B2
(45) Date of Patent: Feb. 7, 2017

(54) PHOTOVOLTAIC SHEATHING ELEMENT WITH ONE OR MORE TABS

(75) Inventors: James R Keenihan, Midland, MI (US); Joseph A Langmaid, Caro, MI (US); Leonardo C. Lopez, Midland, MI (US)

(73) Assignee: DOW GLOBAL TECHNOLOGIES LLC, Midland, MI (US)

( * ) Notice: Subject to any disclaimer, the term of this patent is extended or adjusted under 35 U.S.C. 154(b) by 130 days.

(21) Appl. No.: 14/004,234

(22) PCT Filed: Mar. 22, 2012

(86) PCT No.: PCT/US2012/030027
§ 371 (c)(1),
(2), (4) Date: Sep. 10, 2013

(87) PCT Pub. No.: WO2012/129356
PCT Pub. Date: Sep. 27, 2012

(65) Prior Publication Data
US 2014/0000708 A1    Jan. 2, 2014

Related U.S. Application Data

(60) Provisional application No. 61/466,236, filed on Mar. 22, 2011.

(51) Int. Cl.
*H01L 31/048* (2014.01)
*H02S 20/25* (2014.01)
*H02S 40/36* (2014.01)

(52) U.S. Cl.
CPC ........... *H01L 31/0483* (2013.01); *H02S 20/25* (2014.12); *H02S 40/36* (2014.12); *Y02B 10/12* (2013.01)

(58) Field of Classification Search
CPC ...... H01L 31/0482; H02S 30/10; H02S 30/20; H02S 40/10
See application file for complete search history.

(56) References Cited

U.S. PATENT DOCUMENTS

| 3,767,471 A | 10/1973 | Kasper et al. |
| 4,465,575 A | 8/1984 | Love et al. |
| 5,986,203 A | 11/1999 | Hanoka et al. |

(Continued)

FOREIGN PATENT DOCUMENTS

| CN | 101902174 | 12/2010 |
| EP | 841706 A2 | 5/1998 |

(Continued)

OTHER PUBLICATIONS

Merriam Webster Dictionary Defition of "Width".*

(Continued)

*Primary Examiner* — Jennifer Michener
*Assistant Examiner* — Bethany L Martin
(74) *Attorney, Agent, or Firm* — The Dobrusin Law Firm, P.C.; Daniel P. Aleksynas

(57) ABSTRACT

The present invention is premised upon an assembly that includes at least a photovoltaic sheathing element capable of being affixed on a building structure. The shingle including at least a photovoltaic cell assembly, a body portion attached to one or more portions of the photovoltaic cell assembly. Wherein the body portion includes one or more top peripheral tabs each capable of fitting under one or more vertically adjoining devices.

12 Claims, 10 Drawing Sheets

(56) References Cited

U.S. PATENT DOCUMENTS

| | | | |
|---|---|---|---|
| 2004/0000334 A1* | 1/2004 | Ressler | 136/251 |
| 2004/0187909 A1* | 9/2004 | Sato et al. | F24J 2/4612 |
| | | | 136/251 |
| 2004/0206035 A1 | 10/2004 | Kandalgaonkar | |
| 2005/0011550 A1 | 1/2005 | Chittibabu et al. | |
| 2007/0193618 A1* | 8/2007 | Bressler et al. | H02S 20/25 |
| | | | 136/244 |
| 2007/0256734 A1 | 11/2007 | Guha et al. | |
| 2008/0289272 A1 | 11/2008 | Flaherty | |
| 2008/0302030 A1* | 12/2008 | Stancel et al. | 52/173.3 |
| 2010/0146878 A1 | 6/2010 | Koch | |
| 2010/0180523 A1 | 7/2010 | Lena et al. | |
| 2014/0000709 A1* | 1/2014 | Langmaid et al. | 136/259 |

FOREIGN PATENT DOCUMENTS

| | | | |
|---|---|---|---|
| EP | 1032051 A2 | 8/2000 | |
| EP | 1071139 A2 | 1/2001 | |
| EP | 2093807 A2 | 8/2009 | |
| EP | 2216829 A1 | 8/2010 | |
| FR | 2914785 A1 | 10/2008 | |
| GB | 2407634 | 5/2005 | |
| JP | S50-133502 | 11/1976 | |
| JP | S51-148811 | 11/1976 | |
| JP | S62-096811 | 1/1989 | |
| JP | 226874 A | 2/1989 | |
| JP | 2143468 A | 6/1990 | |
| JP | H03-040274 | 11/1992 | |
| JP | H10-088741 A | 4/1998 | |
| JP | 10189924 A | 7/1998 | |
| JP | 2001-115601 | 4/2001 | |
| WO | 98/36139 A1 | 8/1998 | |
| WO | 2007/035677 A2 | 3/2007 | |
| WO | 2009/137348 A2 | 11/2009 | |
| WO | 2009/137352 | 11/2009 | |
| WO | 2009/137353 | 11/2009 | |
| WO | WO2009137353 * | 11/2009 | H01L 31/042 |
| WO | 2009/137348 A2 | 3/2010 | |
| WO | 2010/144226 A1 | 12/2010 | |
| WO | 2010/151777 A2 | 12/2010 | |

OTHER PUBLICATIONS

Merriam Webster Dictionary Defintion of "Length".*
International Preliminary Report on Patentability dated Nov. 28, 2013; Appln. No. PCT/US2012/030027.
International Search Report & Written Opinion dated Nov. 20, 2013; Appln. No. PCT/US2012/030027.
The Patent Office of the People's Republic of China Action for Application No. 201280014483.X dated May 22, 2015.
The Patent Office of the People's Republic of China Second Office Action dated Oct. 8, 2015 for Application No. 201280014483X.
Third Office Action from the Patent Office of the People's Republic of China for Application No. 201280014483.X, dated May 20, 2016.
JP Office Action dated Sep. 7, 2015 (Mailed Sep. 15, 2015) for Application No. 2014-501223.
Translation of Office Action for Japanese Application No. 2014-501223, dated Nov. 5, 2014.

* cited by examiner

PHOTOVOLTAIC SHEATHING ELEMENT WITH ONE OR MORE TABS

CLAIM OF PRIORITY

This application is a national phase filing under 35 USC §371 from PCT Application serial number PCT/US2012/030027 filed on 22 Mar. 2012, and claims priority therefrom. This application further claims priority from Provisional Application 61/466,236 filed 22 Mar. 2011 both incorporated herein by reference in their entirety.

This invention was made with U.S. Government support under contract DE-FC36-07G017054 awarded by the Department of Energy. The U.S. Government has certain rights in this invention. This application claims priority from U.S. Provisional Application Ser. No. 61/466,236 filed Mar. 22, 2011, incorporated herein by reference.

FIELD OF THE INVENTION

The present invention relates to an improved photovoltaic sheathing element capable of being affixed on a building structure, the sheathing element including at least: a photovoltaic cell assembly in the form of a panel, a body portion attached to one or more portions of the photovoltaic cell assembly, at least a first and a second connector assembly disposed on opposing sides of the photovoltaic sheathing element and capable of directly or indirectly electrically connecting the photovoltaic cell assembly to one or more horizontally adjoining devices, and one or more peripheral tabs each capable of fitting under one or more vertically adjoining devices.

BACKGROUND

Efforts to improve PV devices, particularly those devices that are integrated into building structures (e.g. photovoltaic sheathing elements or exterior wall coverings), to be used successfully, should satisfy a number of criteria. The PV device and the array as installed should be durable (e.g. long lasting, sealed against moisture and other environmental conditions) and protected from mechanical abuse over the desired lifetime of the product, preferably at least 10 years, more preferably at least 25 years. The device should be easily installed into the array of devices (e.g. installation similar to conventional roofing shingles or exterior wall coverings) or replaced (e.g. if damaged). It also should be designed to prevent, as much as possible, water from getting under the device and to the building surface that the device is affixed to.

To make this full package desirable to the consumer, and to gain wide acceptance in the marketplace, the system should be inexpensive to build and install. This may help facilitate lower generated cost of energy, making PV technology more competitive relative to other means of generating electricity.

Existing art systems for PV devices may allow for the device to be directly mounted to the building structure or they may fasten the devices to battens, channels or "rails" ("stand-offs") above the building exterior (e.g. roof deck or exterior cladding). These systems may be complicated, typically do not install like conventional cladding materials (e.g. roofing shingles, tiles, slates, or siding) and, as a consequence, may be expensive to install. Also, they may not be visually appealing as they do not look like conventional building materials. "Stand-offs" to mount PV device every 2-4 feet may be required. Thus, installation cost can be as much or more as the cost of the article. They also may suffer from issues related to environmental conditions such as warping, fading and degradation of its physical properties.

Among the literature that can pertain to this technology include the following patent documents: US20040206035A1; WO2010151777A2; WO2010144226A1; EP2216829A1; and WO1998036139A1, all incorporated herein by reference for all purposes.

SUMMARY OF THE INVENTION

The present invention is directed to a photovoltaic device, and particularly to an improved photovoltaic roofing or building sheathing element, such as a photovoltaic shingle, that preferably is affixed directly to a building structure (e.g. without the use of battens, channels or "rails" ("stand-offs")) above the building exterior) and used in an array of a plurality of photovoltaic sheathing elements and potentially other devices, that addresses at least one or more of the issues described in the above paragraphs. It is contemplated that the improved photovoltaic sheathing element includes at least a photovoltaic cell assembly; a body portion attached to one or more portions of the photovoltaic cell assembly; at least a first and a second connector assembly disposed on opposing sides of the photovoltaic sheathing element and capable of directly or indirectly electrically connecting the photovoltaic cell assembly to one or more horizontally adjoining devices; and the body portion includes one or more peripheral tabs each capable of fitting under one or more vertically adjoining devices when installed in an array and particularly fitting under the electrical connecting area between individual devices.

DETAILED DESCRIPTION OF THE PREFERRED EMBODIMENT

Figure 1:
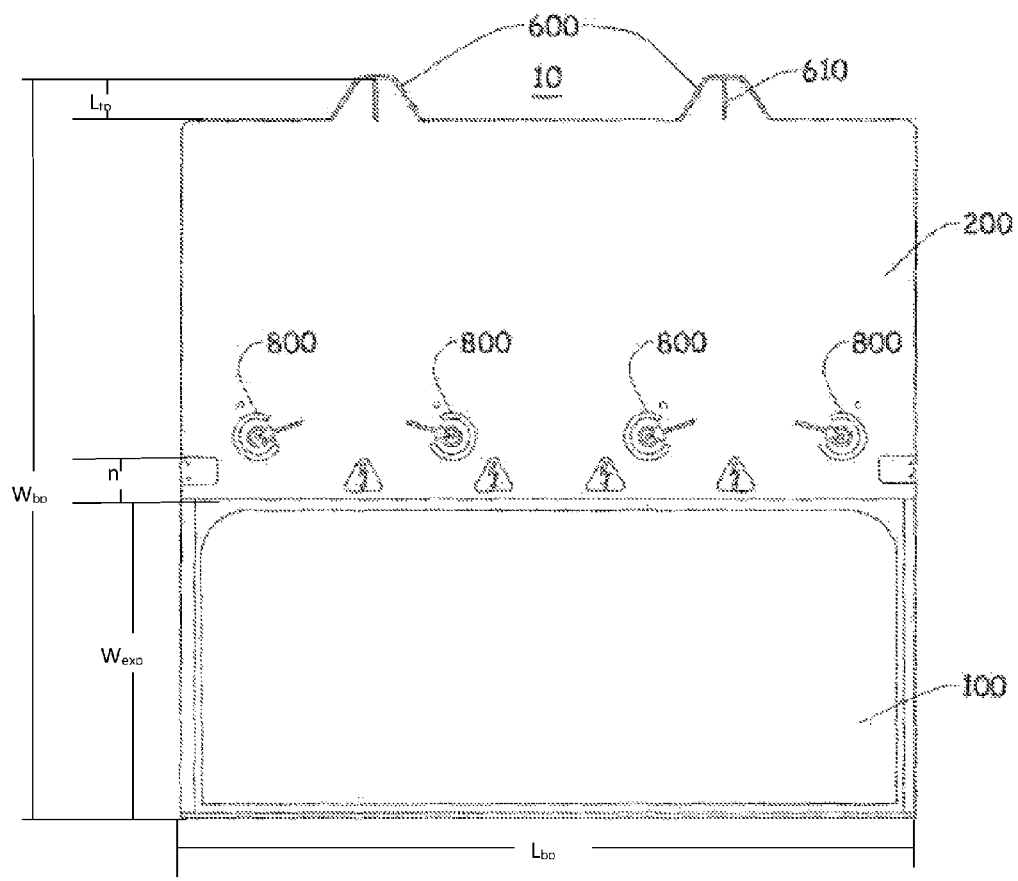
FIG. 1 is a plan view of an example of an improved photovoltaic device according to the present invention.
Figure 3A:
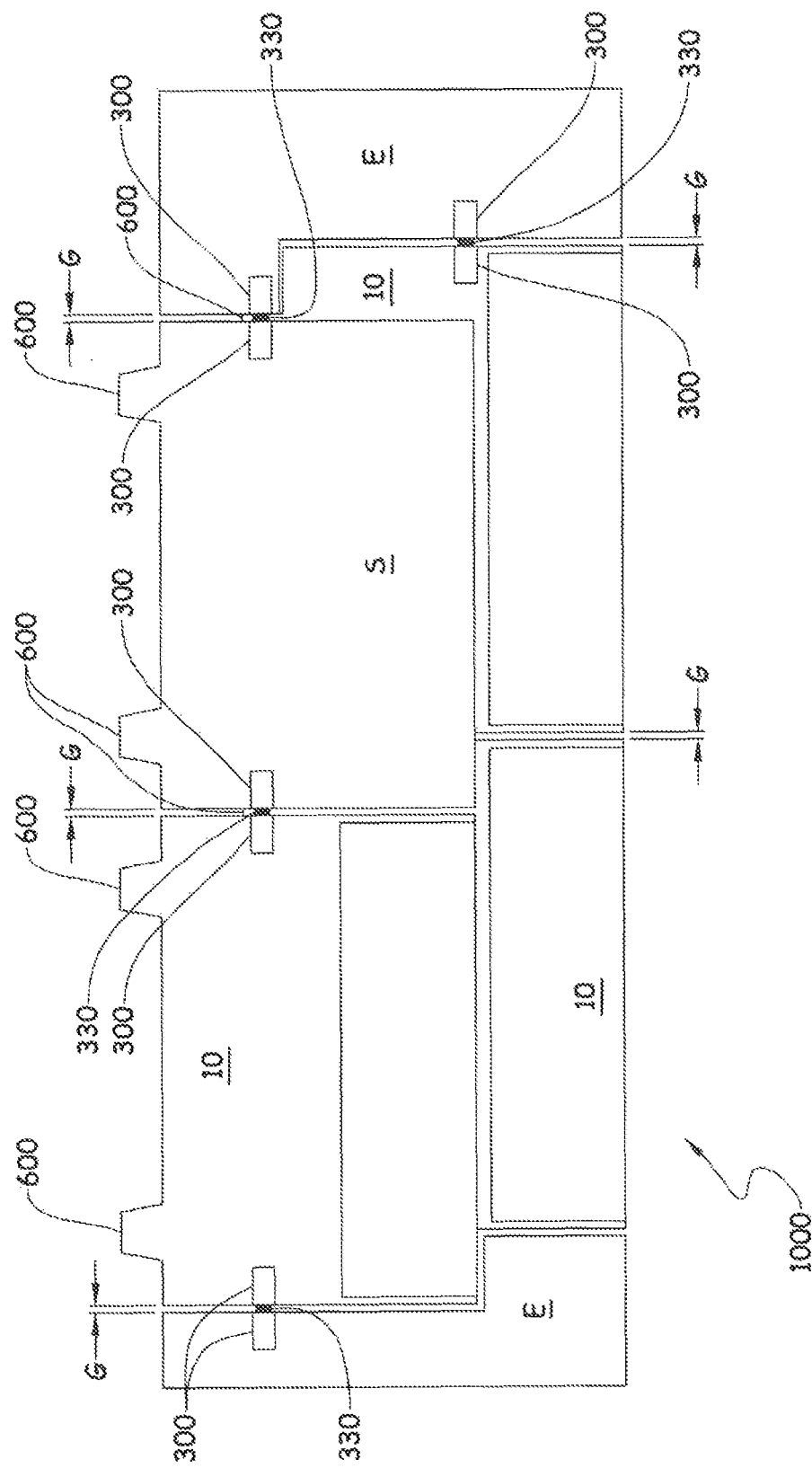
FIG. 3A is a plan view of an exemplary array.
Figure 3B:
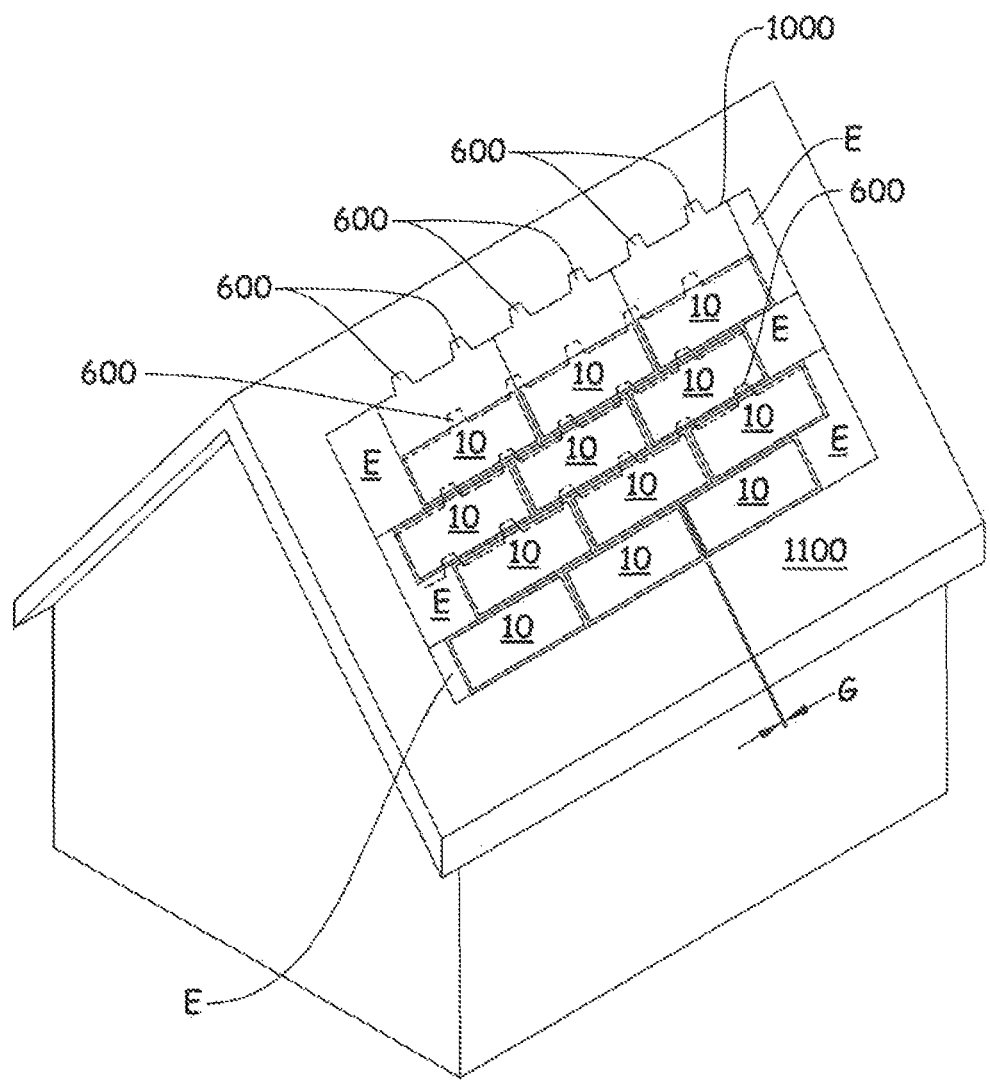
FIG. 3B is a perspective view of another an exemplary array disposed on a building structure.

The present invention relates to an improved photovoltaic device 10 (hereafter "Photovoltaic sheathing element"), as illustrated in FIG. 1, can be described generally as an assembly of a number of components and component assemblies that functions to provide electrical energy when subjected to solar radiation (e.g. sunlight). Of particular interest and the main focus of the present disclosure is an improved Photovoltaic sheathing element 10 that includes at least a photovoltaic cell assembly 100 joined to a body portion 200 that includes one or more peripheral tabs 600. In a preferred embodiment, the Photovoltaic sheathing element is formed by taking the photovoltaic cell assembly (and potentially other components and assemblies such as electrical connection components) and forming (e.g. via injection molding) the body portion about at least portions of the photovoltaic cell assembly. It is contemplated that the relationships (e.g. at least the geometric properties and/or the material properties) between the components and component assemblies (of the Photovoltaic sheathing element 10) and surrounding devices are surprisingly important in solving one or more of the issues discussed in the background section above. Of particular interest in this invention is where the Photovoltaic sheathing element 10 is utilized for what is commonly known as Building-Integrated Photovoltaics, or BIPV and wherein the Photovoltaic sheathing element 10 is connected to other devices (Photovoltaic sheathing elements 10 or otherwise) to form an array 1000, for example an array 1000 as illustrated in FIG. 3B. Each of the components and component assemblies and their relationships are disclosed in greater detail and specificity in the following paragraphs.

Accordingly, pursuant to one aspect of the present invention, there is contemplated an assembly comprising at least a photovoltaic sheathing element capable of being affixed on a building structure, the shingle including at least: a photovoltaic cell assembly, a body portion attached to one or more portions of the photovoltaic cell assembly; and at least a first and a second connector assembly disposed on opposing sides of the photovoltaic sheathing element and capable of directly or indirectly electrically connecting the photovoltaic cell assembly to one or more horizontally adjoining devices; wherein the body portion includes one or more top peripheral tabs each capable of fitting under one or more vertically adjoining devices.

The assembly invention may be further characterized by one or any combination of the features described herein, such as the photovoltaic sheathing element includes a receiving zone capable of receiving the one or more top peripheral tabs, the receiving zone disposed on an underside of the photovoltaic sheathing element; the receiving zone spans across an entire width of the photovoltaic sheathing element; the receiving zone is disposed on an underside of the photovoltaic sheathing element and is comprised of two or more distinct portions; the combination of the one or more top peripheral tabs and at least one of the two or more distinct portions are configured to provide a positive horizontal positioning zone for the photovoltaic sheathing element to the one or more vertically adjoining devices; the one or more top peripheral tabs have a length defined by $L_{tp}=L_{tpn}+L_{tpt}$. Where $L_{tp}=(W_{bp}-(2*W_{exp})-n+C1*(L_{bp}/W_{exp}))+(C2*T_o*(1/\text{roof pitch}))$; the one or more top peripheral tabs includes one or more fluid directing features that are capable of channeling a fluid away from a perimeter edge of the photovoltaic sheathing element; the one or more peripheral tabs are disposed on the shingle in an area adjacent to a predetermined fixation area of the vertically adjoining device Accordingly, pursuant to another aspect of the present invention, there is contemplated an array of assemblies including at least two or more photovoltaic sheathing elements disposed in a first row and two or more photovoltaic sheathing elements disposed in a second, vertically adjacent and horizontally off-set row, the each of the shingles and capable of being affixed on a building structure and including at least: a photovoltaic cell assembly, a body portion attached to one or more portions of the photovoltaic cell assembly; and at least a first and a second connector assembly disposed on opposing sides of the photovoltaic sheathing element and capable of directly or indirectly electrically connecting the photovoltaic cell assembly to one or more horizontally adjoining devices; wherein the body portion includes one or more top peripheral tabs each capable of fitting under one or more vertically adjoining devices.

The array invention may be further characterized by one or any combination of the features described herein, such as the photovoltaic sheathing element includes a receiving zone capable of receiving the one or more top peripheral tabs, the receiving zone disposed on an underside of the photovoltaic sheathing element; the receiving zone is and stretches across an entire width of the photovoltaic sheathing element; the receiving zone is disposed on an underside of the photovoltaic sheathing element and is comprised of two or more distinct portions; the combination of the one or more peripheral tabs and at least one of the two or more distinct portions are configured to provide a positive horizontal positioning zone for the photovoltaic sheathing element to the one or more vertically adjoining devices; the one or more top peripheral tabs have a length defined by $L_{tp}=L_{tpn}+L_{tpt}$. Where $L_{tp}=(W_{bp}-(2*W_{exp})-n+C1*(L_{bp}/W_{exp}))+(C2*T_o*(1/\text{roof pitch}))$; and wherein at least one of the top peripheral tabs are adapted to fit under at least two vertically adjoining devices in an area where an electrical connector is present; the one or more peripheral tabs includes one or more fluid directing features that are capable of channeling a fluid away from a perimeter edge of the photovoltaic sheathing element; the one or more top peripheral tabs are disposed on the shingle in an area adjacent to a predetermined fixation area of the vertically adjoining device.

It should be appreciated that the above referenced aspects and examples are non-limiting, as others exist within the present invention, as shown and described herein.

Photovoltaic Cell Assembly 100

Figure 2:
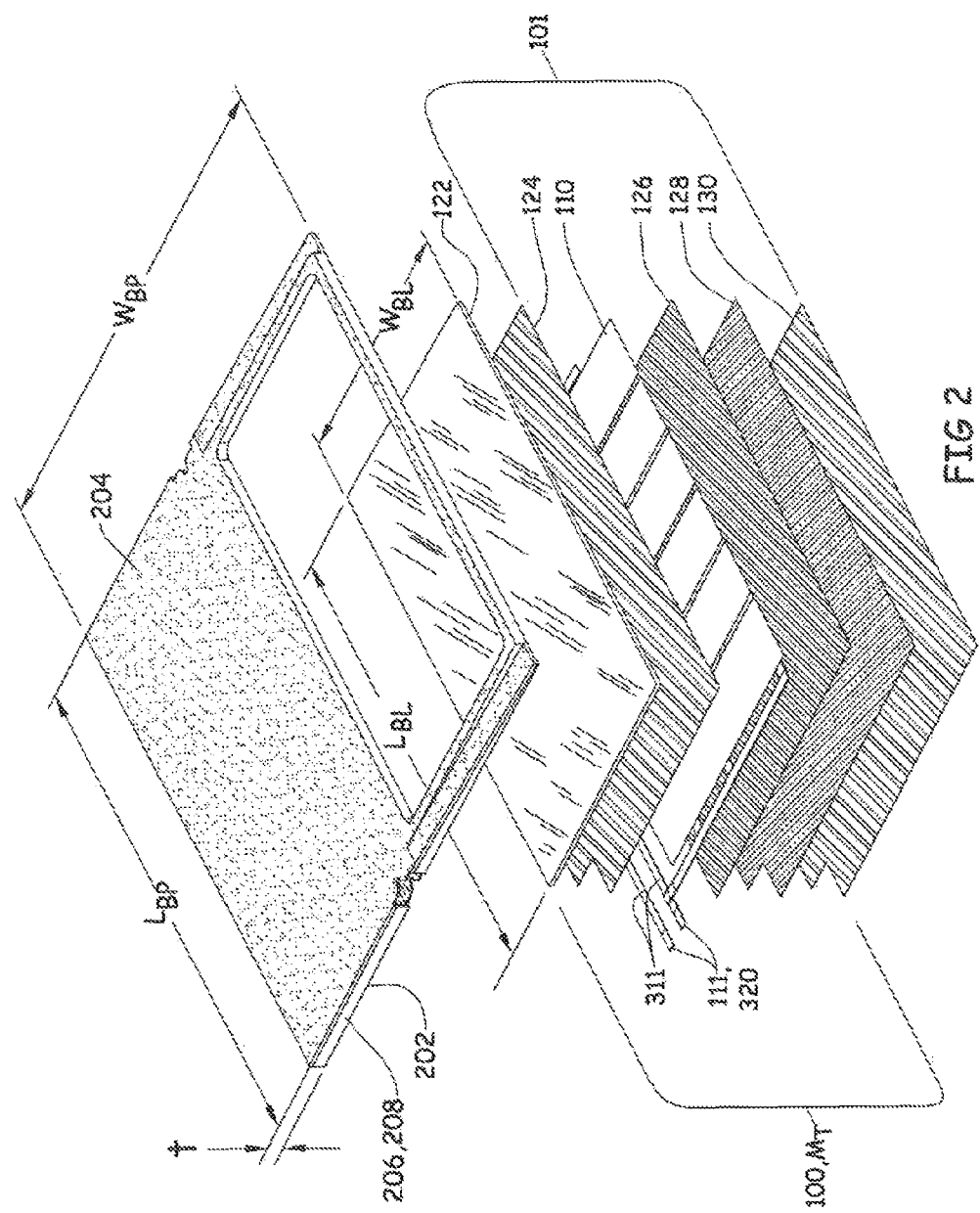
FIG. 2 is an exploded perspective view of an example of an improved photovoltaic device according to the present invention.

It is contemplated that the photovoltaic cell assembly 100 may be a compilation of numerous layers and components/assemblies, for example as disclosed in currently pending International patent application No. PCT/US09/042496, incorporated herein by reference. The photovoltaic cell assembly contains at least a barrier layer 122 and a photovoltaic cell layer 110 (generally located inboard of the peripheral edge of the barrier layer 122). It is contemplated that the photovoltaic cell assembly 100 may also contain other layers, such as encapsulant layers and other protective layers. Illustrative examples are shown in the figures and are discussed below. Exploded views of exemplary photovoltaic cell assemblies 100 are shown in FIGS. 2A and 2B. It is contemplated that the overall photovoltaic cell assembly 100 thickness $M_T$ may be about 1 to 12 mm, preferably about 2 to 9 mm, and most preferably less than about 9.0 mm.

Functionally, these encapsulant layers and other protective layers may include a number of distinct layers that each serve to protect and/or connect the photovoltaic cell assembly 100 together. Each preferred layer is described in further detail below, moving from the "top" (e.g. the layer most exposed to the elements) to the "bottom" (e.g. the layer most closely contacting the building or structure). In general each preferred layer or sheet may be a single layer or may itself comprise sub layers.

Barrier Layer 122

The barrier layer 122 may function as an environmental shield for the photovoltaic cell assembly 100 generally, and more particularly as an environmental shield for at least a portion of the photovoltaic cell layer 110. The barrier layer 122 is preferably constructed of a transparent or translucent material that allows light energy to pass through to the photoactive portion of the photovoltaic cell layer 110. This material may be flexible (e.g. a thin polymeric film, a multi-layer film, glass, or glass composite) or be rigid (e.g. a thick glass or Plexiglas such as polycarbonate). The material may also be characterized by being resistant to moisture/particle penetration or build up. The barrier layer 122 may also function to filter certain wavelengths of light such that unpreferred wavelengths may not reach the photovoltaic cells. In a preferred embodiment, the barrier layer 122 material will also range in thickness from about 0.05 mm to 10.0 mm, more preferably from about 0.1 mm to 4.0 mm, and most preferably from 2.5 mm to 3.5 mm. Other physical characteristics, at least in the case of a film, may include: a tensile strength of greater than 20 MPa (as measured by JIS K7127); tensile elongation of 1% or greater (as measured by JIS K7127); and/or a water absorption (23° C., 24 hours) of 0.05% or less (as measured per ASTM D570); and/or a coefficient of linear expansion ("CLTE") of about $5 \times 10-6$ mm/mm° C. to $100 \times 10-6$ mm/mm° C., more preferably of about $10 \times 10-6$ mm/mm° C. to $80 \times 10-6$ mm/mm° C., and most preferably from about $20 \times 10-6$ mm/mm° C. to $50 \times 10-6$ mm/mm° C. Other physical characteristics, at least in the case of a thick glass, may include: a coefficient of linear expansion ("CLTE") of about $5 \times 10-6$ mm/mm° C. to about $140 \times 10-6$ mm/mm° C., preferably of about $7 \times 10-6$ mm/mm° C. to about $50 \times 10-6$ mm/mm° C., more preferably from about $8 \times 10-6$ mm/mm° C. to about $30 \times 10-6$ mm/mm° C., and most preferably from about $9 \times 10-6$ mm/mm° C. to about $15 \times 10-6$ mm/mm° C. Other physical characteristics, at least in the case of a thick glass, may include: a density of about 2.42 $g/cm^3$ to about 2.52 $g/cm^3$, a tensile strength of between about 75 to 200 N/sq·mm, a compressive strength of between 500 and 1200 N/sq·mm, a modulus of elasticity of between 60-80 GPa, a CLTE of about $9 \times 10-6$ mm/mm° C., and a visible light transmission of at least about 85%, preferably about at least 87%, more preferably at least about 90%.

First Encapsulant Layer 124

In one example of an encapsulant layer, a first encapsulant layer 124 may be disposed below the barrier layer 122 and generally above the photovoltaic cell layer 110. It is contemplated that the first encapsulant layer 124 may serve as a bonding mechanism, helping hold the adjacent layers together. It should also allow the transmission of a desirous amount and type of light energy to reach the photovoltaic cell 110. The first encapsulant layer 124 may also function to compensate for irregularities in geometry of the adjoining layers or translated through those layers (e.g. thickness changes). It also may serve to allow flexure and movement between layers due to temperature change and physical movement and bending. In a preferred embodiment, first encapsulant layer 124 may consist essentially of an adhesive film or mesh, preferably an EVA (ethylene-vinyl-acetate), thermoplastic polyolefin, polyurethanes, ionomers, silicon based polymers or similar material. The preferred thickness of this layer range from about 0.1 mm to 1.0 mm, more preferably from about 0.2 mm to 0.8 mm, and most preferably from about 0.25 mm to 0.5 mm.

Photovoltaic Cell Layer 110

The photovoltaic cell layer 110 contemplated in the present invention may be constructed of any number of known photovoltaic cells commercially available or may be selected from some future developed photovoltaic cells. These cells function to translate light energy into electricity. The photoactive portion of the photovoltaic cell is the material which converts light energy to electrical, energy. Any material known to provide that function may be used including crystalline silicon, amorphous silicon, CdTe, GaAs, dye-sensitized solar cells (so-called Gratezel cells), organic/polymer solar cells, or any other material that converts sunlight into electricity via the photoelectric effect. However, the photoactive layer is preferably a layer of IB-IIIA-chalcogenide, such as IB-IIIA-selenides, IB-IIIA-sulfides, or IB-IIIA-selenide sulfides. More specific examples include copper indium selenides, copper indium gallium selenides, copper gallium selenides, copper indium sulfides, copper indium gallium sulfides, copper gallium selenides, copper indium sulfide selenides, copper gallium sulfide selenides, and copper indium gallium sulfide selenides (all of which are referred to herein as CIGSS). These can also be represented by the formula $CuIn(1-x)GaxSe(2-y)Sy$ where x is 0 to 1 and y is 0 to 2. The copper indium selenides and copper indium gallium selenides are preferred. Additional electroactive layers such as one or more of emitter (buffer) layers, conductive layers (e.g. transparent conductive layers) and the like as is known in the art to be useful in CIGSS based cells are also contemplated herein. These cells may be flexible or rigid and come in a variety of shapes and sizes, but generally are fragile and subject to environmental degradation. In a preferred embodiment, the photovoltaic cell assembly 110 is a cell that can bend without substantial cracking and/or without significant loss of functionality. Exemplary photovoltaic cells are taught and described in a number of US patents and publications, including U.S. Pat. No. 3,767,471, U.S. Pat. No. 4,465,575, US20050011550 A1, EP841706 A2, US20070256734 al, EP1032051A2, JP2216874, JP2143468, and JP10189924a, incorporated hereto by reference for all purposes.

The photovoltaic cell layer 110, for example as illustrated in FIG. 2B, may also include electrical circuitry, such as buss bar(s) 111 that are electrically connected to the cells, the connector assembly component(s) 300 and generally run from side to side of the Photovoltaic sheathing element 10. This area may be known as the buss bar region 311.

Second Encapsulant Layer 126

In another example of an encapsulant layer, a second encapsulant layer 126 is generally connectively located below the photovoltaic cell layer 110, although in some instances, it may directly contact the top layer 122 and/or the first encapsulant layer 124. It is contemplated that the second encapsulant layer 126 may serve a similar function as the first encapsulant layer, although it does not necessarily need to transmit electromagnetic radiation or light energy.

Back Sheet 128

In an example of a protective layer there may be a back sheet 128 which is connectively located below the second encapsulant layer 126. The back sheet 128 may serve as an environmental protection layer (e.g. to keep out moisture and/or particulate matter from the layers above). It is preferably constructed of a flexible material (e.g. a thin polymeric film, a metal foil, a multi-layer film, or a rubber sheet). In a preferred embodiment, the back sheet 128 material may be moisture impermeable and also range in thickness from about 0.05 mm to 10.0 mm, more preferably from about 0.1 mm to 4.0 mm, and most preferably from about 0.2 mm to 0.8 mm. Other physical characteristics may include: elongation at break of about 20% or greater (as measured by ASTM D882); tensile strength or about 25 MPa or greater (as measured by ASTM D882); and tear strength of about 70 kN/m or greater (as measured with the Graves Method). Examples of preferred materials include: glass plate; aluminum foil; poly (vinyl fluoride) (for example, commercially available as Tedlar® (a trademark of DuPont)); poly (ethylene terephthalate); copolymer of tetrafluoroethylene and hexafluoroethylene (also known as "FEP"); poly (ethylene tetrafluoroethylene); poly (ethylene naphthalate); poly (methyl methacrylate); and polycarbonate, or a combination thereof.

Supplemental Barrier Sheet 130

In another example of a protective layer there may be a supplemental barrier sheet 130 which is connectively located below the back sheet 128. The supplemental barrier sheet 130 may act as a barrier, protecting the layers above from environmental conditions and from physical damage that may be caused by any features of the structure on which the Photovoltaic sheathing element 10 is subjected to (e.g. For example, irregularities in a roof deck, protruding objects or the like). It is contemplated that this is an optional layer and may not be required. It is also contemplated that this layer may serve the same functions as the body portion 200. In a preferred embodiment, the supplemental barrier sheet 130 material may be at least partially moisture impermeable and also range in thickness from about 0.25 mm to 10.0 mm, more preferably from about 0.5 mm to 2.0 mm, and most preferably from 0.8 mm to 1.2 mm. It is preferred that this layer exhibit elongation at break of about 20% or greater (as measured by ASTM D882); tensile strength or about 10 MPa or greater (as measured by ASTM D882); and tear strength of about 35 kN/m or greater (as measured with the Graves Method). Examples of preferred materials include thermoplastic polyolefin ("TPO"), thermoplastic elastomer, olefin block copolymers ("OBC"), natural rubbers, synthetic rubbers, polyvinyl chloride, and other elastomeric and plastomeric materials. Alternately the protective layer could be comprised of more rigid materials so as to provide additional roofing function under structural and environmental (e.g. wind) loadings. Additional rigidity may also be desirable so as to improve the coefficient of thermal expansion of the Photovoltaic sheathing element 10 and maintain the desired dimensions during temperature fluctuations. Examples of protective layer materials for structural properties include polymeric materials such polyolefins, polyesters, polyamides, polyimides, polyester amides, polysulfone, acetal, acrylic, polyvinyl chloride, nylon, polycarbonate, phenolic, polyetheretherketone, polyethylene terephthalate, epoxies, including glass and mineral filled composites or any combination thereof.

The above described layers may be configured or stacked in a number of combinations, but it is preferred that the barrier layer 122 is the top layer. Additionally, it is contemplated that these layers may be integrally joined together via any number of methods, including but not limited to: adhesive joining; heat or vibration welding; over-molding; or mechanical fasteners.

For the sake of clarity in view of some of the embodiments discussed below, the photovoltaic cell assembly 100 can be further described in another fashion, as a two part assembly. The first part, the photovoltaic cell subassembly 101, comprising all the layers of the photovoltaic cell assembly 100 (with the exception of the barrier layer 122) and the second part being the barrier layer 122. The barrier layer 122 may also be described as having a length "$L_{BL}$" and a width "$W_{BL}$", for example as labeled in FIG. 2A. Preferably, the $L_{BL}$ ranges from about 0.75 to about 1.25 times that of the $L_{BP}$ discussed below, more preferably the lengths are within about 5-10% of each other. Also contemplated is that the photovoltaic cell assembly subassembly 101 may have an overall CLTE ("subassembly CLTE") that ranges from about $30 \times 10-6$ mm/mm° C. to $150 \times 10-6$ mm/mm° C., more preferably about $50 \times 10-6$ mm/mm° C. to $100 \times 10-6$ mm/mm° C.

Body Portion 200

It is contemplated that the body portion 200 may be a compilation of components/assemblies, but is preferably generally a polymeric article that is formed by injecting a polymer (or polymer blend) into a mold (with or without inserts such as the photovoltaic cell assembly 100 or the other component(s) (e.g. connector component)—discussed later in the application), for example as disclosed in currently pending International patent application No. PCT/US09/042496, incorporated herein by reference. The body portion 200 functions as the main structural carrier for the Photovoltaic sheathing element 10 and should be constructed in a manner consistent with this function. For example, it can essentially function as a plastic framing material. It is contemplated that the body portion 200 should adhere to photovoltaic cell assembly 100 with an adhesion strength no less than the stress due to thermal expansion.

It is contemplated that the compositions that make up the body portion 200 also exhibit a coefficient of linear thermal expansion ("CLTE") of about $0.5 \times 10-6$ mm/mm° C. to about $140 \times 10-6$ mm/mm° C., preferably of about $3 \times 10-6$ mm/mm° C. to about $50 \times 10-6$ mm/mm° C., more preferably from about $5 \times 10-6$ mm/mm° C. to about $30 \times 10-6$ mm/mm° C., and most preferably from about $7 \times 10-6$ mm/mm° C. to about $15 \times 10-6$ mm/mm° C. Most desirably, the CLTE of the composition that makes up the body portion 200 should closely match the CLTE of the barrier layer 122. Preferably the CLTE of the composition making up the body portion 200 disclosed herein are also characterized by a coefficient of linear thermal expansion (CLTE) is within factor of 20, more preferably within a factor of 15, still more preferably within a factor of 10, even more preferably within a factor of 5, and most preferably within a factor of 2 of the CLTE of the barrier layer 122. Matching the CLTE's between the composition comprising the body portion 200 and the barrier layer 122 is important for minimizing thermally-induced stresses on the BIPV device during temperature changes, which can potentially result in cracking, breaking of PV cells, etc.

For some embodiments of the photovoltaic articles disclosed herein, the barrier layer 122 includes a glass barrier layer. If the barrier layer 122 includes a glass layer, the CLTE of the body portion is preferably less than $80 \times 10-6$ mm/mm° C., more preferably less than $70 \times 10-6$ mm/mm° C., still more preferably less than $50 \times 10-6$ mm/mm° C., and most preferably less than $30 \times 10-6$ mm/mm° C. Preferably, the CLTE of the body portion is greater than $5 \times 10-6$ mm/mm° C.

When glass is used (as the barrier layer 122), the compositions of the body material preferably have an elongation at break of at least 3% but not typically more than 200%. It is also contemplated, when glass is not used, that the body material preferably has an elongation at break of at least 100%, more preferably at least 200%, more preferably still at least 300% and preferably no more than 500%. The tensile elongation at break of compositions were determined by test method ASTM D638-08 (2008) @23° C. using a test speed of 50 mm/min.

In a preferred embodiment, the body support portion 200 may comprise (be substantially constructed from) a body material. This body material may be a filled or unfilled moldable plastic (e.g. polyolefins, acrylonitrile butadiene styrene (SAN), hydrogenated styrene butadiene rubbers, polyesters, polyamides, polyester amides, polyether imide, polyimides, polysulfone, acetal, acrylic, polyvinyl chloride, nylon, polyethylene terephthalate, polycarbonate, thermoplastic and thermoset polyurethanes, synthetic and natural rubbers, epoxies, SAN, Acrylic, polystyrene, or any combination thereof). Fillers (preferably up to about 50% by weight) may include one or more of the following: colorants, fire retardant (FR) or ignition resistant (IR) materials, reinforcing materials, such as glass or mineral fibers, surface modifiers. Plastic may also include anti-oxidants, release agents, blowing agents, and other common plastic additives. In a preferred embodiment, glass fiber filler is used. The glass fiber preferably has a fiber length (after molding) ranging from about 0.1 mm to about 2.5 mm with an average glass length ranging from about 0.7 mm to 1.2 mm.

In a preferred embodiment, the body material (composition(s)) has a melt flow rate of at least 5 g/10 minutes, more preferably at least 10 g/10 minutes. The melt flow rate is preferably less than 100 g/10 minutes, more preferably less than 50 g/10 minutes and most preferably less than 30 g/10 minutes. The melt flow rate of compositions were determined by test method ASTM 01238-04, "REV C Standard Test Method for Melt Flow Rates of Thermoplastics by Extrusion Plastometer", 2004 Condition L (230° C./2.16 Kg). Polypropylene resins used in this application also use this same test method and condition. The melt flow rate of polyethylene and ethylene—α-olefin copolymers in this invention are measured using Condition E (190° C./2.16 Kg), commonly referred to as the melt index.

In all embodiments, the compositions have flexural modulus of at least 200 MPa, more preferably at least 400 MPa and most preferably at least 700 MPa. According to the preferred embodiment where the photovoltaic cell assembly 100 includes a glass layer, the flexural modulus is preferably at least 1000 and no greater than 7000 MPa. According to the second embodiment, the flexural modulus is no greater than 1500 MPa, more preferably no greater than 1200 MPa, most preferably no greater than 1000 MPa. The flexural modulus of compositions were determined by test method ASTM D790-07 (2007) using a test speed of 2 mm/min. It is contemplated that the compositions that make up the body portion 200 also exhibit a coefficient of linear thermal expansion ("body CLTE") of about 25×10−6 mm/mm° C. to 70×10−6 mm/mm° C., more preferably of about 27×10−6 mm/mm° C. to 60×10−6 mm/mm° C., and most preferably from about 30×10−6 mm/mm° C. to 40×10−6 mm/mm° C.

It is contemplated that the body portion 200 may be any number of shapes and sizes. For example, it may be square, rectangular, triangular, oval, circular or any combination thereof. The body portion 200 may also be described as having a length "$L_{BP}$" and a width "$W_{BP}$", for example as labeled in FIG. 2 and may be as little as 10 cm and as much as 500 cm or more, respectively. It may also have a thickness (t) that may range from as little as about 1 mm to as much as 20 mm or more and may vary in different area of the body portion 200. Preferably, the body portion 200 can be described as having a body lower surface portion 202, body upper surface portion 204 and a body side surface portion 206 spanning between the upper and lower surface portions and forming a body peripheral edge 208.

Top Peripheral Tab 600

A top peripheral tab 600 may be generally defined as a localized extension of the body section 200. It may functionally perform one or more of the following: aid in the vertical positioning of adjacent devices; aid in the horizontal positioning of adjacent devices; and provide additional protection against water intrusion (e.g. water getting under the Photovoltaic sheathing element 10), for example potentially in and around the area of the connector assembly 300 or in an area where two adjacent devices meet (see gap "G"). In a preferred embodiment, the Photovoltaic sheathing element 10 has two or more tabs 600 disposed along a top edge of the shingle 10. The tabs may be of any shape that performs the recited function. It is contemplated that the peripheral tab 600 may be any number of shapes and sizes. For example, it may be square, rectangular, triangular, oval, circular or any combination thereof. and preferably the tabs are generally square or rectangular in shape The peripheral tab 600 may also be described as having a length "$L_{TP}$", a width "$W_{TP}$", and a thickness "t", for example as labeled in FIG. 1. An illustrative examples is shown in FIG. 1. The tabs 600 are preferably integral to the body portion 200 and have a thickness small enough so that they are capable of fitting under one or more vertically adjoining devices (whether the device does or does not have a receiving zone 700 therein). Furthermore, it is also preferred that the tabs 600 are disposed along the top edge of the Photovoltaic sheathing element in a position such that when placed in an array 1000, at least one tab 600 is adapted to fit under at least two vertically adjoining devices in an area where an electrical connector 300 is present or in an area where two adjacent devices meet (see gap "G"). An illustrative example may be seen in FIG. 3A, referring to tab 600 between the spacer piece "S" and the PV device 10 and tab 600 between the spacer piece "S" and the edge piece "E". It is also preferred that the tabs 600 are disposed in a position such that when placed in an array 1000, the tabs 600 do not fall directly below the fixation area 800 of the immediately vertically adjacent device. FIG. 3B shows the location of the tabs below photovoltaic sheathing elements immediately above the row of sheathing elements that the contain the tabs using dotted lines to show the location. It may be desirable that any fastener used to secure the immediately vertically adjacent device that is sitting on top of the tab 600 not be allowed to go through the tab 600 or through a vertically adjacent device. Another way of defining this is to state that it is preferred that the tab 600 is located such that the fastener is going only through one device and then the structure 1100, the fastener doesn't go through two devices.

Figure 7:
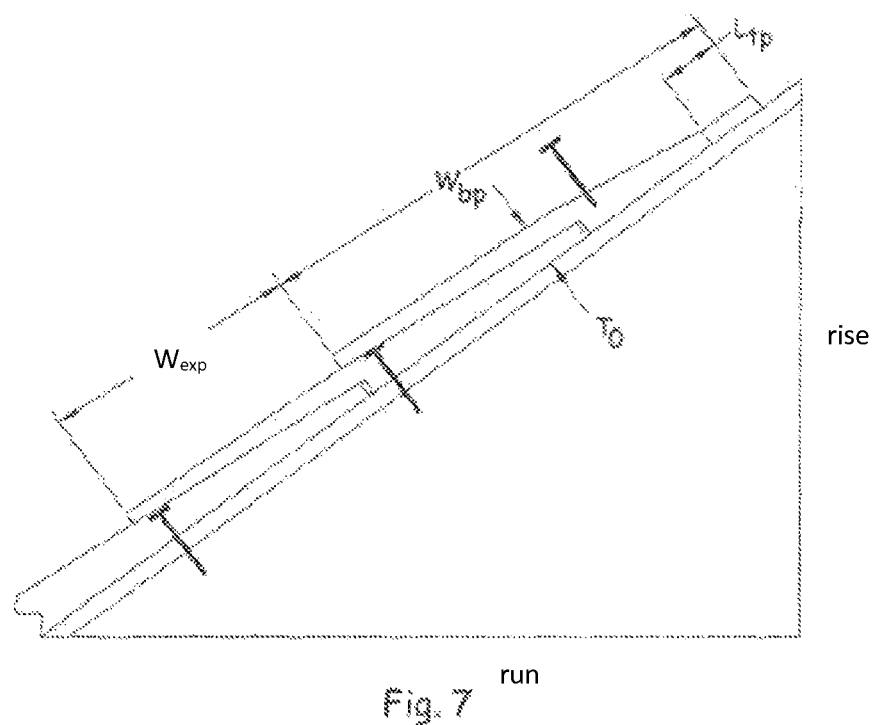
FIG. 7 is a side view of an exemplary array showing rise and run on a building structure.

It is contemplated that the length may be chosen to perform the recited functions of the tabs and may be about 10 mm or greater, but preferably about 15 mm or greater, more preferably about 20 or greater, and preferably no about 100 mm or less, more preferably about 80 mm or less, and most preferably about 60 mm or less. In most cases, it is believed that the tab length of about 35 mm will perform the recited functions. Looking at FIGS. 1, 4 and 7, it can be seen that the length $L_{tp}$ may also be defined by combining calculations for overlap, nail position, device thickness and various factors for compensating for installation tolerance, materials of construction, environment, and other weather related properties. The minimum length for avoidance of overlapping with respect to nail penetrations may be defined by the formula $L_{tpn}=W_{bp}-(2*W_{exp})-n+C1*(L_{bp}/W_{exp})$ where C1 is a constant of about 0 or greater, more preferably about 0.05 or greater, and most preferably about 0.1 or greater. The minimum length for avoidance of overlapping with respect to nail penetrations may be defined by the formula $L_{tpn}=W_{bp}-(2*W_{exp})-n+C1*(L_{bp}/W_{exp})$ where C1 is a constant of about 2 or less, more preferably about 1.2 or less, and most preferably about 0.6 or less. The constant may include any subset between about 0 and about 2. Additional tab height may be required as the device thickness increases at the overlap portion. This is specifically of value as the thickness increases as is in the case of photovoltaic products that are intended to integrate with the building and provide the roofing function. Again, referring to FIGS. 1, 4 and 7, this additional length may be defined as $L_{tpt}=C2*T_o*(1/\text{roof pitch})$, where C2 is a constant of about 0.5 or greater, or any subset between about 0.5 and 3, more preferably about 0.7 or greater, and most preferably about 0.8 or greater, and $T_o$ is the device thickness at the overlap location, and roof pitch=rise/run C2 may be a constant of about 3 or less, more preferably about 2 or less, and most preferably about 1.5 or less. C2 may be part of any subset between about 0.5 and 3. These equations may be combined to determine the total length for the tab, where $L_{tp}=L_{tpn}+L_{tpt}$. Where $L_{tp}=(W_{bp}-(2*W_{exp})-n+C1*(L_{bp}/W_{exp}))+(C2*T_o*(1/\text{roof pitch}))$.

It is contemplated that the tab width may be about 15 mm or greater, but preferably about 30 mm or greater, more preferably about 40 mm or greater, and most preferably about 50 mm or greater, and preferably about 200 mm or less, more preferably about 150 mm or less, and most preferably about 120 mm or less. It is also contemplated that the tab 600 could be up to the full width of shingle, but preferably would have at least local cut outs in the areas of the fixation area 800 that allow for fasteners to go through unimpeded.

It may also have a thickness (t) that may range from about 0.5 mm to 20.0 mm, preferably about 0.5 mm or greater, more preferably about 1.0 mm or greater and most preferably about 2.0 mm or greater, and preferably about 20.0 mm or less, more preferably about 15.0 mm or less and most preferably about 10.0 mm or less. It is contemplated that the thickness may vary in different area of the peripheral tab 600 (e.g. see fluid directing features below where it can be locally thicker or thinner).

The peripheral tab 600 can also be described as having a peripheral tab lower surface portion 602, peripheral tab upper surface portion 604 and a peripheral tab side surface portion 606 spanning between the upper and lower surface portions and forming a body peripheral edge 608.

Figure 4:
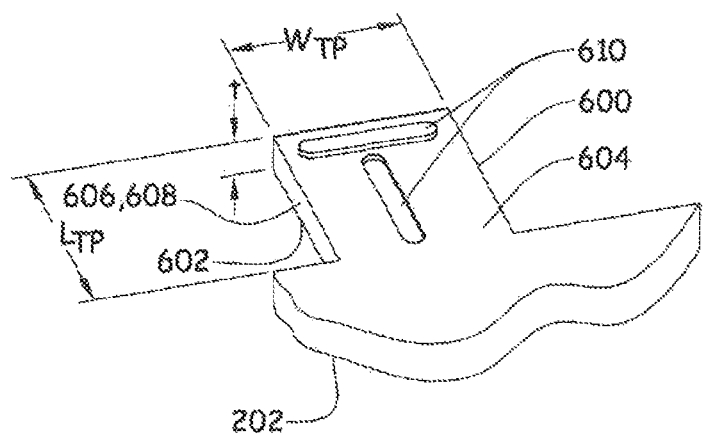
FIG. 4 is a perspective view of a tab with exemplary fluid directing features.
Figure 5A:
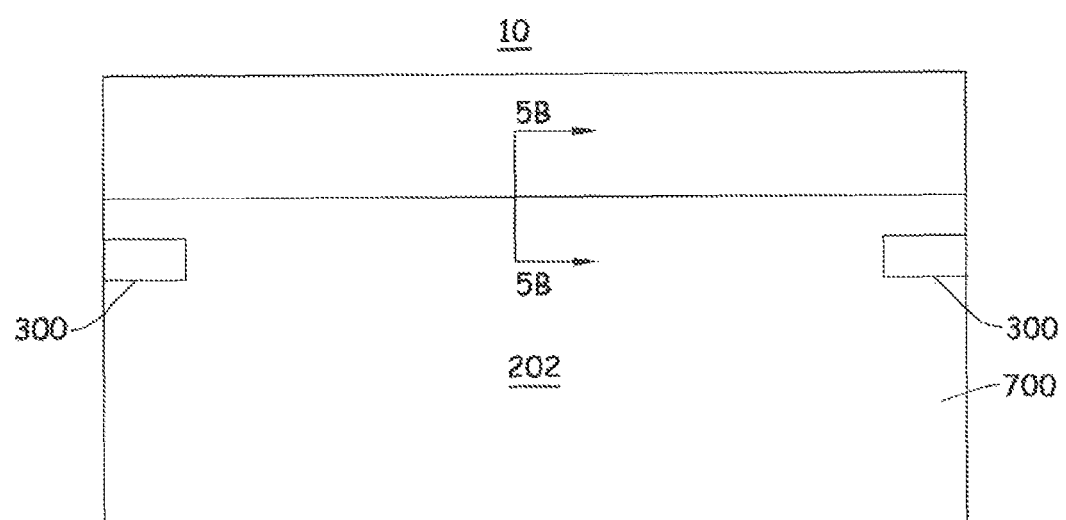
FIG. 5A is a plan view of the underside of an example of an improved photovoltaic device according to the present invention.
Figure 5B:
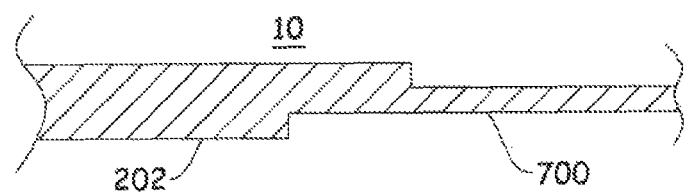
FIG. 5B is a side view of a section of FIG. 6A.
Figure 6A:
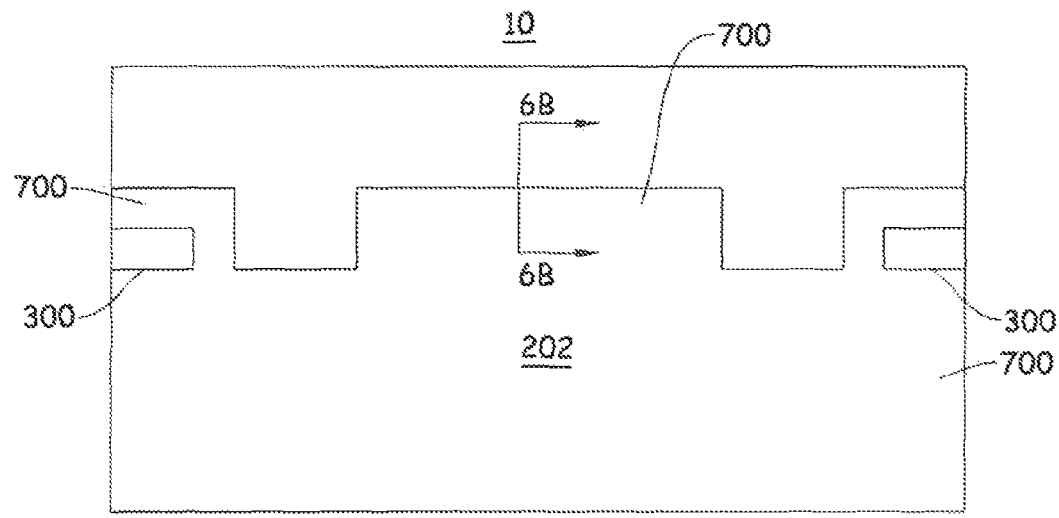
FIG. 6A is a plan view of the underside of another example of an improved photovoltaic device according to the present invention.
Figure 6B:
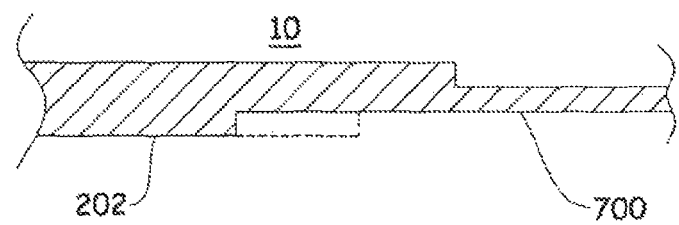
FIG. 6B is a side view of a section of FIG. 7A.

In one preferred embodiment, the tab 600 will include fluid directing features 610. These features may aid in the channeling of water away from the edge of the Photovoltaic sheathing element 10 and help prevent the water from reaching the underside of the shingle 10 (e.g. body lower surface portion 202). Contemplated fluid directing features 610 may include geometric shapes disposed in/on the otherwise planer surface of the tab 600, such as valleys or projections in, for example as seen in FIG. 4. Other contemplated features 610 may include the addition of compressible materials to the surface of the tab 600, such as gasket materials, elastomers, caulk, or similar sealing materials. It is contemplated that any or all of the fluid directing features 610 may not be limited to only the area of the tab 600, but may continue into the main portion of the body 200.

Receiving Zone 700

A receiving zone 700 functions as a clearance area for the peripheral tabs 600 of an adjoining device. It is where, at least locally, the Photovoltaic sheathing element 10 or other device, has a thickness that is capable of receiving the one or more peripheral tabs and not causing the Photovoltaic sheathing element 10 or other device to be bent or otherwise distorted when affixed to the building structure. Typically, the receiving zone may be disposed on an underside of the Photovoltaic sheathing element or other device. Two illustrative examples are shown in FIGS. 6A through 7B, wherein a continuous receiving zone 700 and separate receiving zones 700 are presented. In the case of the continuous receiving zone 700, the combination of the tabs 600 and zone 700 may help with vertical positioning of the devices in the vertically adjacent row. In the case of a device with separate receiving zones 700, the combination of the tabs 600 and zone 700 may help with both the vertical and horizontal positioning of the devices in the vertically adjacent row. Preferably the dimensions of the zones 700 (length and/or width) are larger than that of the tabs 600. In a preferred embodiment, the dimensions of the zone 700 are about 2 percent larger or greater than the tabs 600, more preferably about 5 percent larger or greater, most preferably about 7 percent larger or greater, and preferably about 25 percent larger or less, more preferably about 15 percent larger or less and most preferably about 10 percent larger or less.

Fixation Area 800

A fixation area 800 is an area of the Photovoltaic sheathing element 10 where it is desirable through which to secure (e.g. via fasteners such as nails, screws, clips, etc.) the shingle 10 to the building structure. The area 800 is preferably positively identified on. the Photovoltaic sheathing element 10 such that an installer may easily ascertain the proper area in which to drive the nail, screw, or other fasteners. As shown in FIG. 1, in one illustrative example, a plurality of semi-circles and text identify the preferred fixation area 800.

Connector Assembly 300

The connector assembly generally functions to allow for electrical communication to and/or from the Photovoltaic sheathing element 10. This communication may be in conjunction with circuitry connected to the photovoltaic cell layer 110 or may just facilitate communication through and across the Photovoltaic sheathing element 10 via other circuitry. The connector assembly may be constructed of various components and assemblies, and may be partially or fully integral to (embedded within) the Photovoltaic sheathing element 10. It may also include both a rigid and flexible portions. The assembly 300 may or may not require the used with a separate component (e.g. see bridging connectors 330 shown in FIG. 9) to facilitate the electrical communication. Illustrative examples/embodiments of possible configurations are shown in the drawing figures and discussed in the subsequent paragraphs.

Figure 8:
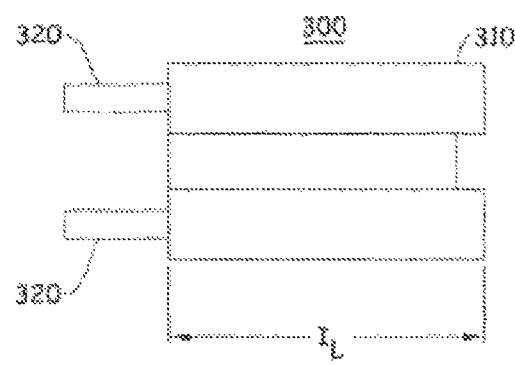
FIG. 8 is a view of an exemplary connector housing.

Preferably the connector assembly 300 comprises at least a polymer based housing 310 and electrical leads 320 protruding outward from the housing 310 and generally embedded in the Photovoltaic sheathing element 10, although other configurations are contemplated. It is contemplated that the housing 310 can be adapted to either receive a mating connector or to be received into a mating connector, for example as shown in FIG. 8. Additionally shown in FIGS. 9 to 12 is a connector pocket 1200 (with and without a bridge 1210, in which the connector 300 may be disposed.

Polymer Housing 310

Figure 10:
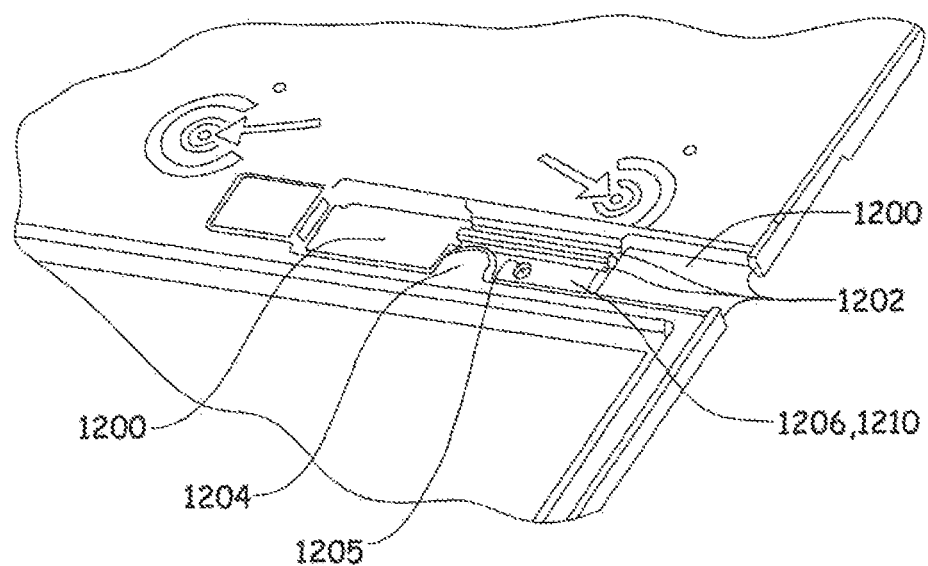
FIGS. 10 and 11 is a close up perspective view of examples of an improved photovoltaic device for use with a flexible connector assembly and containing a flexible connector assembly.
Figure 11:
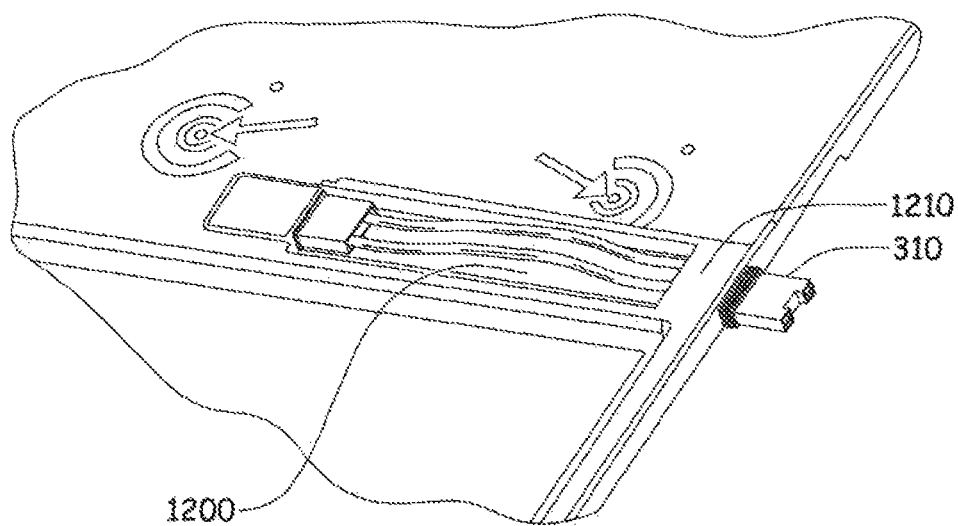

In a first example, an illustrative connector housing 310 as shown in FIG. 10. In this example, the housing is adapted to receive a mating connector (connector mating component), for example it may be configured to be used in conjunction with a bridging connector 330 to allow for electrical communication to and/or from the Photovoltaic sheathing element 10. In a second example, a a connector housing may be adapted to be received into a mating connector (connector mating component).

It is contemplated that the housing 310 may be constructed of any number of materials (as shown above), but preferably with material characteristics such as: a tensile modulus that is at least about 0.1 GPa, more preferably about 1 GPa, and most preferably about 10 GPa or more; ultimate elongation value of about 1 percent, more preferably about 1.5 percent, and most preferably about 2.5 percent or more; coefficient of linear thermal expansion value of about $50 \times 10-6$ mm/mm° C., more preferably about $30 \times 10-6$ mm/mm° C., and most preferably about $20 \times 10-6$ mm/mm° C.

Electrical Leads 320

It is contemplated that the leads 320 may be constructed of any number of materials and geometric shapes, so long as they function to conduct electricity. They also may include both ridged and flexible portions. In the case where the connector assembly 300 is fully integral to (embedded within) the Photovoltaic sheathing element 10, the lead 320 may not require the flexible portion and is not the subject of the present invention. The embodiments wherein the leads 320 have a flexible portion are contemplated to be part of the present invention and are further detailed below.

Figure 12:
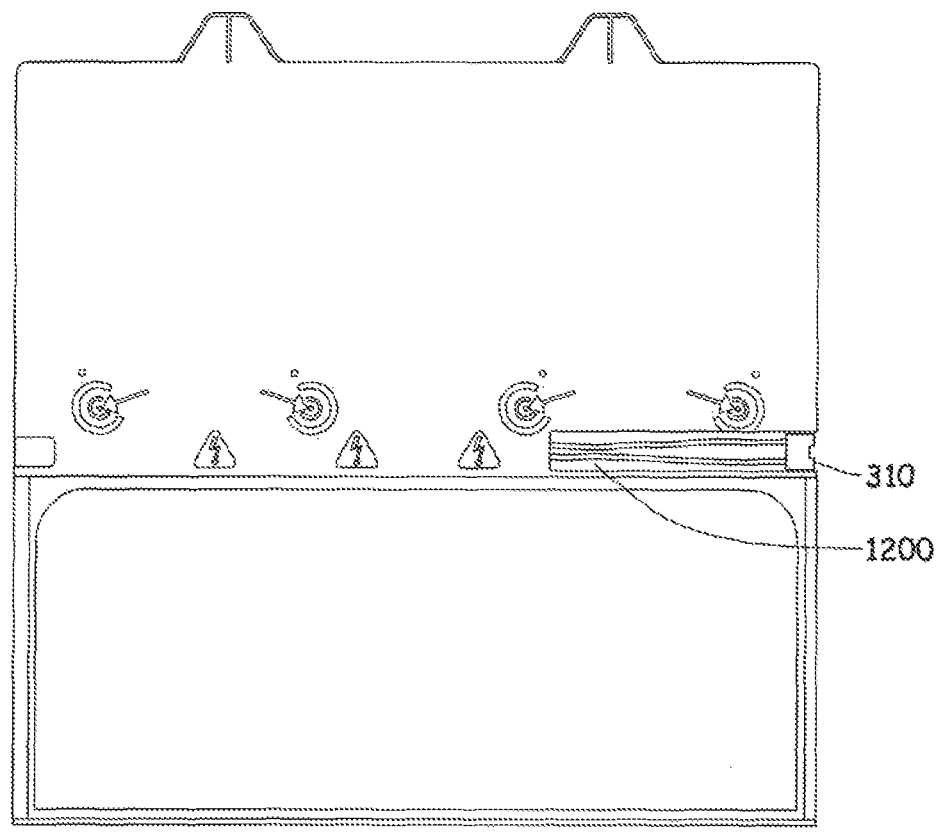
FIG. 12 is a view of another example of an improved photovoltaic device and a flexible connector assembly.

In a first illustrative embodiment, the leads 320 may be connected to the housing 310 on one end and connected to the Photovoltaic sheathing element 10 in the opposing end (e.g. bonded to the photovoltaic cell assembly 110), for example as shown in FIG. 12.

Figure 9:
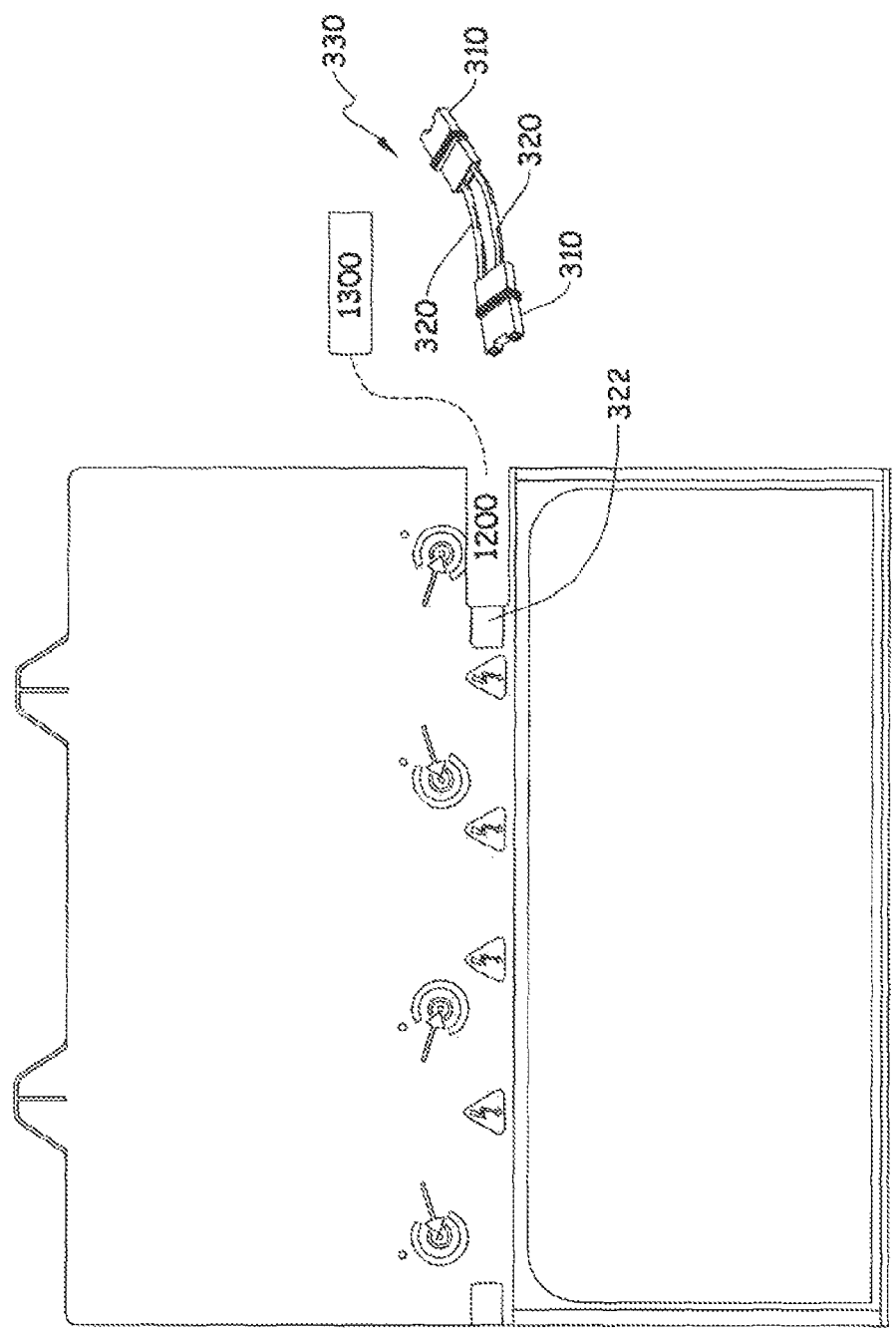
FIG. 9 is an exploded view of an example of an improved photovoltaic device and a flexible connector assembly.

In a second illustrative embodiment, the leads 320 may be connected to two separate housings 310 disposed on opposing ends, for example as shown in FIG. 9 and then connected to the Photovoltaic sheathing element 10 (e.g. mechanically attached to the photovoltaic cell assembly 110 with a connector mating component 322 or an integrated connector assembly 300). As stated generally above, the leads 320 may include both ridged and flexible portions. At a minimum, the leads 320 should be able to flex a distance such that the flexible portion moves at least a distance equal to an interface length $I_L$ of the connector assemblies, thus allowing for the opposing connectors to engage and disengage and in a preferred embodiment, the leads 320 are constructed of wire strands, preferably coated or insulated wire.

Figure 13:
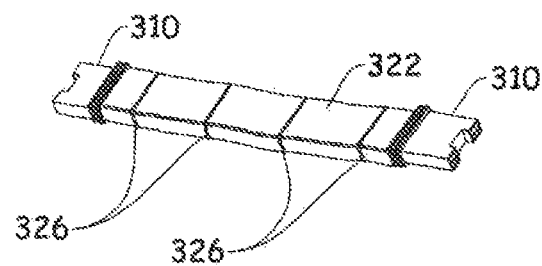
FIG. 13 is a perspective view of another flexible connector assembly example.

In another illustrative embodiment, as shown in FIG. 13, the leads are part of (preferably disposed within) a flexible connector module 322 that includes locally flexible joints 326. In this embodiment, the module 324 is connected to the Photovoltaic sheathing element 10 via the connector mating component 322. For the sake of clarity, "bonded" may include the use of process and structures such as, but not limited to, soldering, adhesives (conductive and otherwise), welding, and the like. "Mechanically attached" may include the use of process and structures such as, but not limited to, screws, clips, crimping, press-fitting, folding, twisting, and the like.

Array of Devices 1000

An array of devices (e.g. Photovoltaic sheathing elements 10, spacer devices, edge pieces, etc) function to provide electrical energy when subjected to solar radiation (e.g. sunlight). An array is a collection of interconnected devices as installed on a building structure 1100. For the purposes of this invention, it is contemplated that the array 1000 is installed directly on an existing roof deck (or exterior surface) of a building structure 1100, or over a previously installed roofing material (e.g. asphalt shingles), in the same way traditional roofing shingles are applied (unless otherwise noted herein). These arrays 1000 may be made up of two or more rows of adjoining devices, the rows containing at least two or more devices themselves. As an illustrative example, shown in FIG. 3A, the array 1000 presented has 2 rows, with 2 devices per row and shared edge pieces on each end (Photovoltaic sheathing element 10, edge piece "E", spacer device "S"). An edge piece "E" generally functions to connect multiple rows of devices together, and may or may not include other functional elements. A spacer device "S" generally may function to connect devices within a row, and may or may not include other functional elements. In another illustrative example, shown in FIG. 3B, the array 1000 presented has 4 rows, with 3 devices per row and shared edge pieces on each end (Photovoltaic sheathing element 10, edge piece "E", spacer device "S"), this clearly shown on the building structure 1100. The devices are connected to one another. According to one preferred embodiment, as can clearly be seen in FIG. 3A, the devices are electrically connected to one another via the connector assembly 300 and a bridging connector 330. It is contemplated that the bridging connector 330 may be a separate component ("indirectly electrically connecting the photovoltaic cell assembly") or integral ("directly electrically connecting the photovoltaic cell assembly") to the connector assembly 300. It is contemplated that the embodiments or examples described above may not be mutually exclusive and may be used in combination with each other.

Unless stated otherwise, dimensions and geometries of the various structures depicted herein are not intended to be restrictive of the invention, and other dimensions or geometries are possible. Plural structural components can be provided by a single integrated structure. Alternatively, a single integrated structure might be divided into separate plural components. In addition, while a feature of the present invention may have been described in the context of only one of the illustrated embodiments, such feature may be combined with one or more other features of other embodiments, for any given application. It will also be appreciated from the above that the fabrication of the unique structures herein and the operation thereof also constitute methods in accordance with the present invention.

Unless otherwise stated, the coefficient of linear expansion ("CLTE") for the materials and assemblies disclosed herein is determined on a TA Instruments TMA Model 2940 by test method ASTM E1824-08 (2008) in a temperature range of −40° C. and 90° C., at 5° C. per minute, using the standard software provided with the instrument. The skilled artisan will appreciate that a composition may exhibit temperature ranges where the CLTE changes from other regions as the material undergoes thermal transitions. In such a case, the preferred ranges for CLTE above refer to the largest measured CLTE for the compositions, assemblies and/or barrier layer 122. A photovoltaic device may include many different materials, including materials with very different CLTE. For example, a PV assembly may include solar cells, metal conductors, polymeric encapsulants, barrier materials such as glass, or other disparate materials, all with different CLTE's. The CLTE of a PV assembly may be determined by measuring the dimensions of the assembly at a number of temperatures between −40° C. and 90° C. This temperature range is also assumed for all other physical properties (testing) unless otherwise specified.

The preferred embodiment of the present invention has been disclosed. A person of ordinary skill in the art would realize however, that certain modifications would come within the teachings of this invention. Therefore, the following claims should be studied to determine the true scope and content of the invention. Any numerical values recited in the above application include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner. Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints. The disclosures of all articles and references, including patent applications and publications, are incorporated by reference for all purposes. The term "consisting essentially of" to describe a combination shall include the elements, ingredients, components or steps identified, and such other elements ingredients, components or steps that do not materially affect the basic and novel characteristics of the combination. The use of the terms "comprising" or "including" describing combinations of elements, ingredients, components or steps herein also contemplates embodiments that consist essentially of the elements, ingredients, components or steps. Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps.

What is claimed is:

1. An assembly comprising:
   a photovoltaic sheathing element capable of being affixed on a building structure, the photovoltaic sheathing element including at least:
   a body portion having:
   a top side,
   a bottom side opposing the top side,
   a first side edge,
   a second side edge opposing the first side edge, the first side edge and the second side edge extending between and connecting the top side and the bottom side, and
   a receiving zone disposed on an underside of the body portion;
   a photovoltaic cell assembly, the photovoltaic cell assembly having one or more portions attached to the body portion; and
   at least a first connector assembly located in the first side edge and a second connector assembly disposed in the second side edge of the photovoltaic sheathing element and capable of directly or indirectly electrically connecting the photovoltaic cell assembly to one or more horizontally adjoining devices;
   wherein the body portion includes two or more top peripheral tabs that are a localized extensions of the top side of the body portion and the two or more top peripheral tabs are each capable of fitting under a bottom edge of one or more vertically adjoining devices;
   wherein the receiving zone includes two or more distinct grooves formed within a back surface of the underside of the body portion for receiving the two or more top peripheral tabs of the one or more vertically adjoining devices such that each of the two or more grooves receives a single one of the two or more top peripheral tabs.

2. The assembly according to claim 1, wherein the combination of the two or more top peripheral tabs and the two or more distinct grooves of the receiving zone provide a positive horizontal positioning zone for the photovoltaic sheathing element to the one or more vertically adjoining devices.

3. The assembly according to claim 1, wherein the two or more top peripheral tabs have a length defined by $L_{tp}=L_{tpn}+L_{tpt}$ where $L_{tp}=(W_{bp}-(2*W_{exp})-n+C1*(L_{bp}/W_{exp}))+(C2*T_o*(1/\text{roof pitch}))$.

4. The assembly according to claim 1, wherein the two or more top peripheral tabs each include one or more fluid directing features that channel a fluid away from a perimeter edge of the photovoltaic sheathing element.

5. The assembly according to claim 1, wherein the two or more top peripheral tabs are disposed on the photovoltaic sheathing element in an area that is laterally adjacent to a predetermined fixation area of the one or more vertically adjoining devices.

6. The assembly according to claim 1, wherein the two or more top peripheral tabs aid in vertically positioning the photovoltaic sheathing element relative to adjacent devices and the two or more top peripheral tabs have a thickness that is small enough so that the two or more top peripheral tabs are capable of fitting under the one or more vertically adjoining devices.

7. The assembly according to claim 1, wherein at least one of the two or more top peripheral tabs is in a position to so that the at least one top peripheral tab fits under at least two vertically adjoining devices.

8. The assembly according to claim 7, wherein the at least one top peripheral tab fits in an area where an electrical connector is present.

9. The assembly according to claim 4, wherein the two or more top peripheral tabs have a planar surface and each of the one or more fluid directing features is a projection disposed on the planar surface of the two or more top peripheral tabs.

10. The assembly according to claim 7, wherein the at least one of the two or more top peripheral tabs fits in an area where the at least two vertically adjoining devices meet.

11. The assembly according to claim 4, wherein the two or more top peripheral tabs have a planar surface and each of the one or more fluid directing features is a valley disposed on the planar surface of the two or more top peripheral tabs.

12. The assembly according to claim 9, wherein the one or more fluid directing features are a compressible material and the compressible material is selected from a gasket material, an elastomer or caulk.

* * * * *

UNITED STATES PATENT AND TRADEMARK OFFICE
CERTIFICATE OF CORRECTION

PATENT NO. : 9,564,545 B2  
APPLICATION NO. : 14/004234  
DATED : February 7, 2017  
INVENTOR(S) : James R. Kennihan et al.

Page 1 of 1

It is certified that error appears in the above-identified patent and that said Letters Patent is hereby corrected as shown below:

In the Claims

Column 16, Line 11, delete "a" after "that are"

Signed and Sealed this  
Sixteenth Day of May, 2017

Michelle K. Lee  
*Director of the United States Patent and Trademark Office*